US012794136B1

(12) United States Patent
Yao

(10) Patent No.: US 12,794,136 B1
(45) Date of Patent: Nov. 10, 2026

(54) VERTICAL TRANSITION FROM CPW TO AIR WAVEGUIDE USING HALF-MODE EXCITATION

(71) Applicant: Oculii Corp., Beavercreek, OH (US)

(72) Inventor: Jun Yao, Wesley Chanpel, FL (US)

(73) Assignee: Oculii Corp., Beavercreek, OH (US)

( * ) Notice: Subject to any disclaimer, the term of this patent is extended or adjusted under 35 U.S.C. 154(b) by 86 days.

(21) Appl. No.: 18/818,014

(22) Filed: Aug. 28, 2024

Related U.S. Application Data

(63) Continuation of application No. 17/958,268, filed on Sep. 30, 2022, now Pat. No. 12,176,610, which is a continuation-in-part of application No. 17/945,379, filed on Sep. 15, 2022.

(51) Int. Cl.

| | |
|---|---|
| ***H01Q 13/02*** | (2006.01) |
| ***H01Q 1/48*** | (2006.01) |
| ***H05K 1/02*** | (2006.01) |
| ***H05K 1/11*** | (2006.01) |

(52) U.S. Cl.
CPC ............... *H01Q 13/02* (2013.01); *H01Q 1/48* (2013.01); *H05K 1/0237* (2013.01); *H05K 1/115* (2013.01)

(58) Field of Classification Search
CPC ........ H01Q 13/02; H01Q 1/48; H05K 1/0237; H05K 1/115
See application file for complete search history.

(56) References Cited

U.S. PATENT DOCUMENTS

2015/0270616 A1* 9/2015 Jafarlou ................ H01Q 13/02 29/601

* cited by examiner

*Primary Examiner* — Daniel D Chang
(74) *Attorney, Agent, or Firm* — Maiorana Patent Law, PA

(57) ABSTRACT

An apparatus comprising a first layer, a second layer and a third layer. The first layer may comprise a plurality of first through via openings, a plurality of first blind openings and a coplanar waveguide input. The second layer may comprise a plurality of second through via openings, a plurality of second blind via openings and an aperture. The third layer may comprise a ground. The coplanar waveguide input may comprise a vertical transition to a waveguide. The first through via openings and the second through via openings may provide a through via between the first, second and third layer. The first blind via openings may provide a blind via from the first to the second layer. The second blind via openings may provide a blind via from the second to the third layer. The coplanar waveguide input may transmit an output from a circuit to the waveguide.

20 Claims, 9 Drawing Sheets

VERTICAL TRANSITION FROM CPW TO AIR WAVEGUIDE USING HALF-MODE EXCITATION

This application relates to U.S. patent application Ser. No. 17/958,268, filed on Sep. 30, 2022, which relates to U.S. patent application Ser. No. 17/945,379, filed on Sep. 15, 2022, which is hereby incorporated by reference in its entirety.

FIELD OF THE INVENTION

The invention relates to radar devices generally and, more particularly, to a method and/or apparatus for implementing a vertical transition from coplanar waveguide to air waveguide using half-mode excitation.

BACKGROUND

A radio frequency (RF) waveguide is a structure that guides an electromagnetic (EM) wave by restricting the transmission of energy to one direction. Waveguides are designed to guide the EM wave with minimal loss of energy. A typical RF waveguide is implemented as a tunnel with metal surfaces that have a rectangular shape. The cut off frequency of the EM wave that propagates inside the waveguide is a property that is controlled by the size of the rectangular tunnel of the waveguide.

In order to achieve a high resolution of data, an automotive radar needs a large antenna array aperture. To implement a multi-input multi-output (MIMO) radar, a sparse array may be implemented with the antennas widely separated from each other. To achieve wide separation for a sparse array of antennas, a long routing trace length is needed. In traditional transmission lines, such as a Microstrip, coplanar waveguide (CPW) or substrate-integrated waveguide (SIW), the routing loss can be a significant amount, which will directly reduce a detection range and accuracy of the antenna array. At radar frequency, the loss in a waveguide is typically 1/10th of the traditional transmission lines.

Microstrip and CPW transmission lines also suffer from radiation at bending sections. Waveguides have almost no radiation outside of the air tunnel. Since a routing trace is on the same side of the antenna array, any radiation from the trace will distort the antenna pattern and downgrade radar beam calibration.

Most Monolithic Microwave Integrated Circuits (MMIC) comprise a planar RF output using a microstrip or CPW. Transmitting the RF signal from the microstrip or CPW into the waveguide is a challenging problem. Conventional designs for a CPW to waveguide transition have shortcomings. Transitions that implement a metal post cannot be fabricated in mass production. Transitions in a Low-Temperature Co-fired Ceramic (LTCC) have the flexibility to set blind vias between PCB layers, but are only able to be fabricated using multiple layers of LTCC, which has a high cost.

It would be desirable to implement a vertical transition from coplanar waveguide to air waveguide using half-mode excitation.

SUMMARY

The invention concerns an apparatus comprising a first layer, a second layer and a third layer. The first layer may comprise a plurality of first through via openings, a plurality of first blind openings and a coplanar waveguide input. The second layer may comprise a plurality of second through via openings, a plurality of second blind via openings and an aperture. The third layer may comprise a ground. The coplanar waveguide input may comprise a vertical transition to a waveguide. The first through via openings and the second through via openings may provide a through via between the first layer, the second layer and the third layer. The plurality of first blind via openings may provide a blind via from the first layer to the second layer. The plurality of second blind via openings may provide a blind via from the second layer to the third layer. The coplanar waveguide input may be configured to transmit an output from a circuit to the waveguide.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
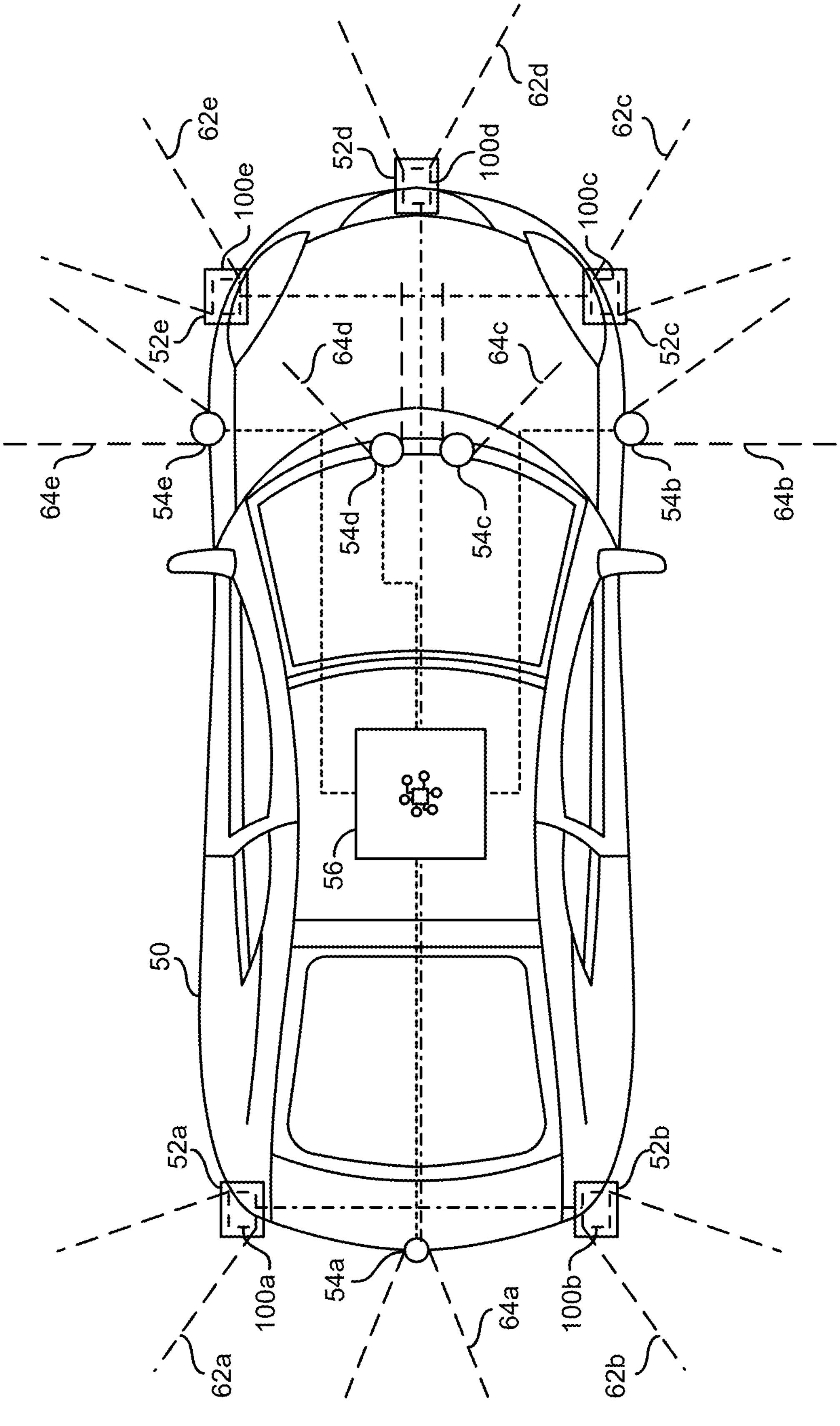
FIG. 1 is a diagram illustrating an embodiment of the present invention implemented in a vehicle.

Embodiments of the present invention include providing a vertical transition from coplanar waveguide to air waveguide using half-mode excitation that may (i) implement a waveguide as a routing trace to compensate for electromagnetic losses in a long routing length, (ii) implement a sparse array of antennas with wide separation, (iii) implement a waveguide-fed horn integrated into a two layer board, (iv) provide a compact transition from a coplanar waveguide to an air waveguide, (v) provide a low loss and wide band transition, (vi) implement a vertical transition suitable for mass production, (vii) have a low insertion loss, (viii) achieve high radiation efficiency in an ultra wide bandwidth for more than 17 GHz, and/or (ix) be implemented as one or more integrated circuits.

Embodiments of the present invention may be configured to implement a compact, low loss and wide band transition from a coplanar waveguide (CPW) to an air waveguide. An antenna array may be implemented comprising the air waveguide as a routing trace. A large antenna array aperture may be implemented in order to achieve a high resolution of data. For example, the antenna array may be implemented for an automotive radar. The antenna array may be a sparse antenna array configured as a multi-input multi-output (MIMO) radar. To achieve a wide separation for the sparse array of antennas, a long routing trace length may be implemented. The waveguide may be configured to compensate for electromagnetic (EM) losses that may occur in a long routing length. The waveguide implemented may provide a low loss and low radiation tracing route for an antenna array. Due to the relatively high loss from the microstrip or CPW, the routing length on the printed circuit board (PCB) may be limited such that as much of the routing as possible may be in the waveguide board.

Embodiments of the present invention may be configured to be implemented with a low overall fabrication cost. For example, mass production in an automotive application may become expensive when millions of units are sold. To keep overall fabrication costs low, the antenna array may be integrated as a two-piece waveguide board with a vertical transition from a printed circuit board (PCB) to the two-piece waveguide board. In an example, the two-piece waveguide board may provide a waveguide network for an E-band antenna array (e.g., operating at radio frequencies from approximately 60 GHz-90 GHz in the EM spectrum). Embodiments of the present invention may be modifiable for long range radar detection or short range radar detection. The integrated antenna array may enable a wide operation frequency band to overcome high fabrication and assembly to ensure a high radiation efficiency at a predefined range of detection frequencies.

The vertical transition may be implemented to communicate a radio frequency (RF) signal output from a Monolithic Microwave Integrated Circuit (MMIC) connected to the PCB (e.g., a CPW) to the two-piece air waveguide. The vertical transition may be designed to be suitable for mass production at a low cost. The PCB implementing the CPW with the vertical transition may comprise an air waveguide aperture. The compact design of the embodiments of the present invention may comprise the air waveguide aperture having a width of less than 1 mm, which may enable an efficient PCB layout.

Embodiments of the present invention may comprise a CPW with a vertical transition that provides a wide bandwidth and low insertion loss. In one example, the wide bandwidth may be approximately 17 GHz (20 GHz may be achieved). The wide bandwidth may be provided under the fabrication tolerances for mass production. The low insertion loss may be approximately 0.3 dB-0.4 dB when operating at approximately 76 GHz-77 GHz (e.g., a worst case loss may be 0.8 dB in the 17 GHz band). The compact design may enable multiple vertical transitions to be placed side by side to connect with MMIC ports without CPW fan-out. The compact design may enable easy launching for the air waveguide board for both direction (e.g., forward propagation and backward propagation).

Referring to FIG. 1, a diagram illustrating an embodiment of the present invention implemented in a vehicle is shown. A top down view of a vehicle 50 is shown. In the example shown, the vehicle 50 may be a car. In some embodiments, the vehicle 50 may be a truck, an ATV, an airplane, a drone, etc. In one example, the vehicle 50 may be an electric vehicle (EV). In another example, the vehicle 50 may be a hybrid electric vehicle. In yet another example, the vehicle 50 may be an internal combustion engine (ICE) vehicle. The type of the vehicle 50 may be varied according to the design criteria of a particular implementation.

The vehicle 50 may comprise a number of blocks (or circuits) 52*a*-52*e*, a number of blocks (or circuits) 54*a*-54*e* and/or a block (or circuit) 56. The circuits 52*a*-52*e* may each implement a radar sensor. The circuits 54*a*-54*e* may each implement a camera system. The circuit 56 may implement a processor. The circuits 52*a*-52*e* may each comprise a respective one of a number of blocks (or circuits) 100*a*-100*e*. The circuits 100*a*-100*e* may each implement an apparatus (or device). While the radar sensors 52*a*-52*e* and the camera systems 54*a*-54*e* are shown, the vehicle 50 may comprise more or fewer of the radar sensors 52*a*-52*e* and/or the camera systems 54*a*-54*e*. In some embodiments, the vehicle 50 may comprise multiple implementations of the processor 56. The vehicle 50 may comprise other components (not shown). The number, type and/or arrangement of the components of the vehicle 50 may be varied according to the design criteria of a particular implementation.

The radar sensors 52*a*-52*e* may each be configured to determine a proximity and/or location of objects/obstacles around the vehicle 50. The radar sensors 52*a*-52*e* may be configured as long-range and/or short-range sensors. The radar sensors 52*a*-52*e* may be configured to generate a radar signal, which may be reflected back to the radar sensors 52*a*-52*e* by the objects near the vehicle 50.

Pairs of dashed lines 62*a*-62*e* are each shown extending from a respective one of the radar sensors 52*a*-52*e*. The pairs of dashed lines 62*a*-62*e* may represent a radio frequency pattern emitted by the respective radar sensors 52*a*-52*e*. The shape, intensity and/or direction of the radio frequency patterns 62*a*-62*e* may determine a detection range of the radar sensors 52*a*-52*e*. The radar sensors 52*a*-52*e* are implemented at various locations around the vehicle 50. The radio frequency patterns 62*a*-62*e* may be generally emitted all around the vehicle 50 in order to capture data in all directions from the vehicle 50. The radio frequency patterns 62*a*-62*e* may have a range of approximately 200 meters to 450 meters, with a 150 degree azimuth field of view and a 45 degree elevation field of view. The particular range of the radio frequency patterns 62*a*-62*e* may be varied according to the design criteria of a particular implementation.

The apparatuses 100*a*-100*e* may each implement an antenna array and/or waveguide network. The antenna array and/or waveguide network implemented by the apparatuses 100*a*-100*e* may enable a sparse array configured to provide a high resolution of data. In an example, the apparatuses 100*a*-100*e* may each be configured to generate a dynamic waveform that uses artificial intelligence to learn from and/or adapt to the environment near the vehicle 50. The sparse array implemented by the apparatuses 100*a*-100*e* may enable a high resolution of data to be acquired with a low module cost. The apparatuses 100*a*-100*e* may be configured to receive the high resolution of data while consuming between 3 watts to 10 watts of power. Details of the antenna array and/or waveguide network implemented by the apparatuses 100*a*-100*e* may be varied according to the design criteria of a particular implementation.

The camera systems 54*a*-54*e* may be configured to capture images and/or generate video frames of the environment near the vehicle 50. The video frames generated by the camera systems 54*a*-54*e* may be used for computer vision operations to detect objects/obstacles around the vehicle 50. The camera systems 54*a*-54*e* may comprise RGB cameras, RGB-IR cameras, stereo cameras, monocular cameras, thermal imaging cameras, etc. The number and/or types of the camera systems 54*a*-54*e* implemented may be varied according to the design criteria of a particular implementation.

Pairs of dashed lines 64*a*-64*e* are each shown extending from a respective one of the camera systems 54*a*-54*e*. The pairs of dashed lines 64*a*-64*e* may represent a field of view captured by the camera systems 54*a*-54*e*. The fields of view 64*a*-64*e* of the camera systems 54*a*-54*e* may or may not overlap with the radio frequency patterns 62-62*e* of the radar sensors 52*a*-52*e*. The camera systems 54*a*-54*e* are implemented at various locations around the vehicle 50. The fields of view 64*a*-64*e* may be generally captured all around the vehicle 50 in order to capture data in all directions from the vehicle 50 (e.g., a 360 degree field of view). The particular range and/or directions of the fields of view 64*a*-64*e* may be varied according to the design criteria of a particular implementation.

The processor 56 is shown at a generally central location in the vehicle 50. In an example, the processor 56 may implement a zone processor. The processor 56 may be configured to receive input comprising the output from the radar sensors 52*a*-52*e* and/or the video frames generated by the camera systems 54*a*-54*e*. In some embodiment, multiple implementations of the processor 56 may be implemented near groups (or clusters) of the radar sensors 52*a*-52*e* and/or the camera systems 54*a*-54*e*. The location of the processor 56 and/or the number of the radar sensors 52*a*-52*e* and/or camera systems 54*a*-54*e* that provide data to the processor 56 may be varied according to the design criteria of a particular implementation.

The processor 56 may be configured to process raw data streams generated by the radar sensors 52*a*-52*e*, the camera systems 54*a*-54*e* and/or other sensors. The processor 56 may be configured to implement deep sensor fusion in order to combine interpretations of the data from the radar sensors 52*a*-52*e* with interpretations of the data from the camera systems 54*a*-54*e* and/or data inputs from other sensors (not shown) in order to make inferences using multiple sources of data that would not be possible based on one of the data sources alone. In an example, the processor 56 may be configured to interpret the high resolution data generated by the radar sensors 52*a*-52*e*. In another example, the processor 56 may be configured to perform computer vision operations on the video frames generated by the camera systems 54*a*-54*e* in order to detect objects.

The processor 56 may be configured to implement central compute capabilities that enable high performance without implementing a dedicated processor for each of the radar sensors 52*a*-52*e*. Implementing the processor 56 may enable the radar sensors 52*a*-52*e* to be implemented at a lower cost because a dedicated processor may not be implemented for each of the radar sensors 52*a*-52*e*. The processor 56 may be configured to enable sparsity in the implementation of the radar sensors 52*a*-52*e* in order to determine the boundary conditions for a particular resolution of data. The processor 56 may enable the radar sensors 52*a*-52*e* to undersample the environment while preventing artifacts, grading lobes and/or false alarms.

The processor 56 may be configured to adaptively modulate the information generated by the radar sensors 52*a*-52*e* to enable fewer antennas to be implemented in the antenna arrays of the apparatuses 100*a*-100*e*. Instead of processing data from the radar sensors 52*a*-52*e* at the edge (e.g., one processor on-board with the same technology node for each of the radar sensors 52*a*-52*e*), the sparse data from the radar sensors 52*a*-52*e* may be processed by the processor 56. The sparse antenna array implemented by the apparatuses 100*a*-100*e* may enable low bandwidth data to be transmitted from the radar sensors 52*a*-52*e* to the processor 56. The processor 56 may be configured to expand the resolution of data received from the radar sensors 52*a*-52*e*. The processor 56 may be configured to dynamically shift radar processing capabilities around the vehicle 50 on an as-needed basis in response to various detection scenarios. The processor 56 may be configured to implement joint bistatic processing from multiple of the distributed radar sensors 52*a*-52*e* to provide a high resolution and/or sensitivity.

Figure 2:
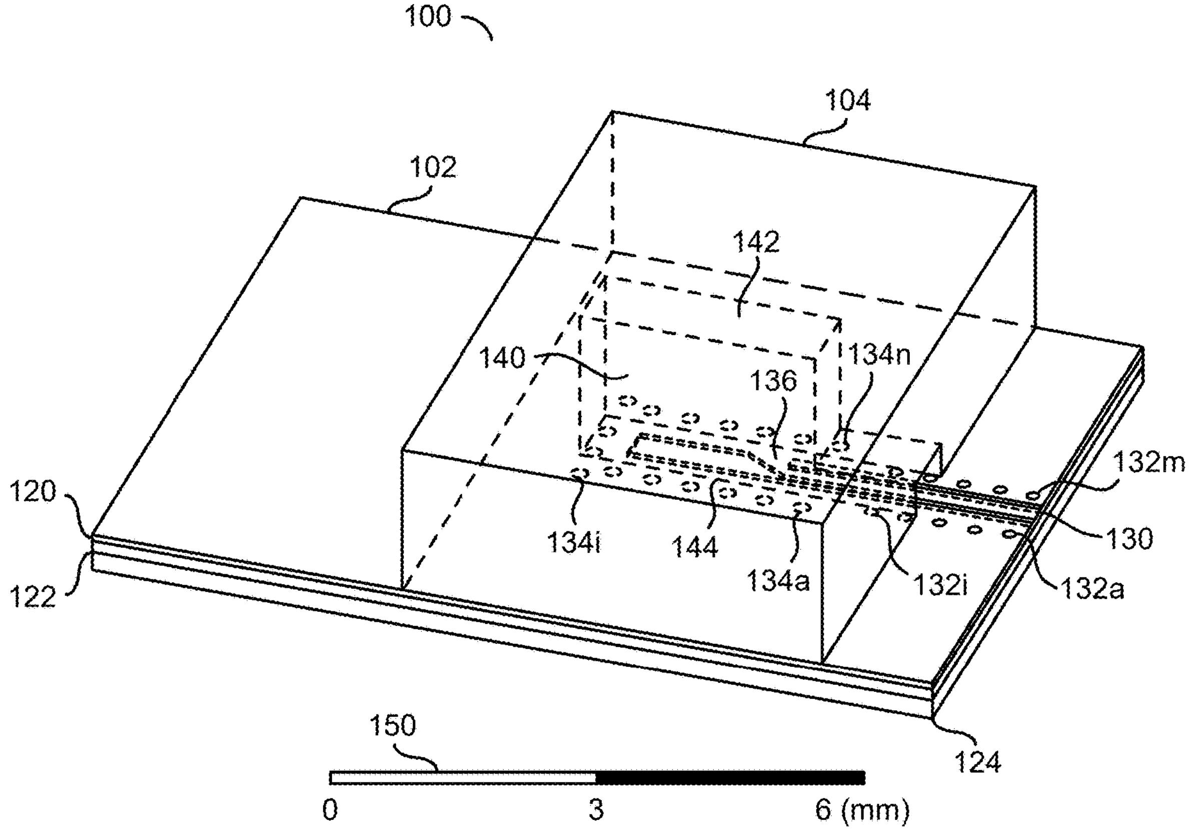
FIG. 2 is a diagram illustrating an example embodiment of the present invention.

Referring to FIG. 2, a diagram illustrating an example embodiment of the present invention is shown. The apparatus 100 is shown. The apparatus 100 may be a representative example of one of the antenna arrays and/or waveguide networks 100*a*-100*n* described in association with FIG. 1. A perspective view of the apparatus 100 is shown.

The apparatus 100 may comprise a printed circuit board 102 and/or a waveguide board 104. In one example, the printed circuit board (PCB) 102 may implement a CPW. In another example, the PCB 102 may implement a microstrip. In yet another example, the PCB 102 may implement a stripline. In still another example, the PCB 102 may implement a Substrate Integrated Waveguide (SIW). The implementation of the PCB 102 may be varied according to the design criteria of a particular implementation.

The waveguide board 104 may implement an air waveguide. The waveguide board 104 may be implemented on top of the PCB 102. The PCB 102 may be configured to implement a vertical transition to the waveguide board 104. The apparatus 100 may be configured to implement a compact, low loss and wide band transition from the PCB 102 to the waveguide board 104. The compact transition may enable less of a routing trace for communicating a RF signal to be implemented on the PCB 102 and more of the routing trace to be implemented in the waveguide board 104. Details of the waveguide board 104 may be described in association with FIG. 6.

The PCB 102 may comprise at least three layers. The PCB 102 may comprise a top layer 120, a middle layer 122 and/or a lower layer 124. From the perspective view shown, the top layer 120 is shown. The waveguide board 104 may be on top of the top layer 120. The PCB 102 may comprise additional layers. For example, the PCB 102 may comprise one or more dielectric layers in between the layers 120-124. The number of layers, the thickness of the layers and/or the material of the layers may be varied according to the design criteria of a particular implementation.

The PCB 102 may comprise an input 130. The input 130 may be a RF signal input. The input 130 may be implemented as part of the top layer 120. The input 130 may be configured to receive an output from a circuit (not shown). For example, the circuit may be implemented on and/or connected to the PCB 102. The circuit may be a MMIC configured to transmit a RF signal. The input 130 may receive the RF signal output from the MMIC and vertically transmit the RF signal to the waveguide board 104.

The top layer 120 may comprise the input 130, a number of openings 132*a*-132*m*, a number of openings 134*a*-134*n* and/or a transition 136. The openings 132*a*-132*m* may be arranged around a metal strip for the input 130. The openings 134*a*-134*n* may be arranged around the transition 136. The transition 136 may comprise a vertical transition to the waveguide board 104. In one example, the transition 136 may implement a coplanar waveguide input configured to transmit an output from the MMIC to the waveguide board 104.

The waveguide board 104 may comprise a waveguide 140, an output 142 and/or an air waveguide aperture 144. The waveguide 140 may be an air waveguide. For example, the waveguide 140 may be a space and/or cavity carved out from the material of the waveguide board 104. The air waveguide aperture 144 may be located around the transition 136 of the top layer 120. The output 142 may be a waveguide output. In an example, the transition 136 may be at the air waveguide aperture 144 at a bottom of the waveguide board 104 and the waveguide output 142 may be located on top of the waveguide board 104. In one example, the waveguide output 142 may be implemented as a horn antenna aperture. The size and/or shape of the air waveguide 140 may be varied according to the design criteria of a particular implementation.

The MMIC may transmit the RF signal to the PCB 102 via the input 130. The PCB 102 may communicate the RF signal from the MMIC up to the bottom of the air waveguide 140 (e.g., via the air waveguide aperture 144) vertically using the transition 136. The RF signal may travel through the air waveguide 140 to the waveguide output 142. The waveguide output 142 may emit the RF signal.

A reference scale 150 is shown. The reference scale 150 may show a measurement of 3 mm and 6 mm. In the example shown, the PCB 102 may be approximately 10 mm-12 mm. The metal strip for the input 130 may be a straight line approximately 3 mm-4 mm in length. The waveguide board 104 may extend up from the PCB 102 approximately 2 mm-3 mm. The apparatus 100 may provide a compact, low loss and wide band transition from a CPW (e.g., the PCB 102) to the air waveguide board 104. The compact design of the apparatus 100 may be low cost. The low cost and compact implementation of the apparatus 100 may be suitable for mass production (e.g., enable producing the apparatuses 100*a*-100*n* for use in multiple radar sensors 52*a*-52*n* implemented on the vehicle 50).

Figure 3:
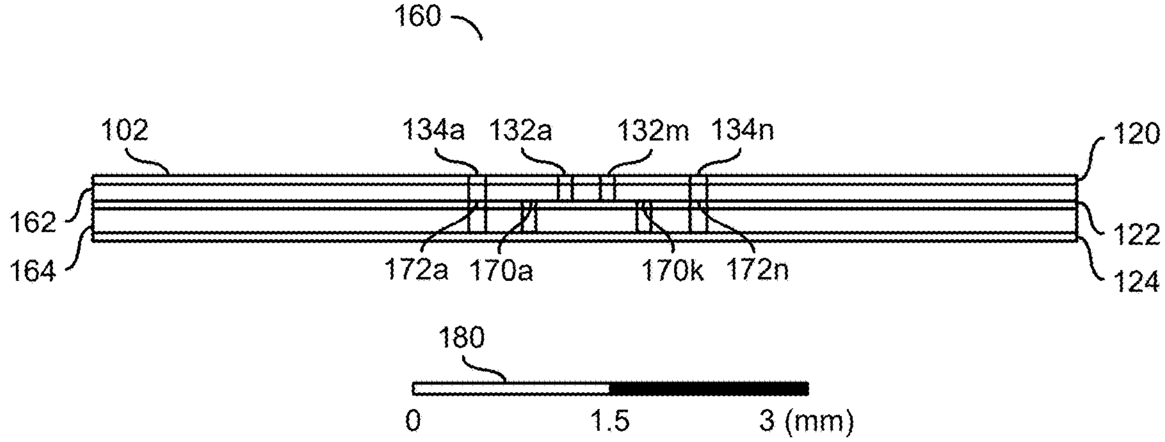
FIG. 3 is a diagram illustrating a side view of the layers of a printed circuit board.

Referring to FIG. 3, a diagram illustrating a side view of the layers of a printed circuit board is shown. A side view 160 of the PCB 102 is shown. The top layer 120, the middle layer 122 and the lower layer 124 are shown in the side view 160. For example, the PCB 102 may be a three-layer PCB. In some embodiments, the PCB 102 may comprise additional layers (not shown). For example, the PCB 102 may comprise one or more layers under the lower layer 124. The number of layers used to implement the PCB 102 may be varied according to the design criteria of a particular implementation.

Insulation may be implemented in between the layers 120-124. The PCB 102 may comprise a dielectric layer 162 and a dielectric layer 164. The dielectric layer 162 may be implemented in between the top layer 120 and the middle layer 122. The dielectric layer 164 may be implemented in between the middle layer 122 and the lower layer 124.

The openings 132*a*-132*m*, the openings 134*a*-134*n*, openings 170*a*-170*k* and openings 172*a*-172*n* are shown. In the example shown, the openings 132*a*-132*m* may be configured to extend through the top layer 120 and the dielectric layer 162 to the middle layer 122. In the example shown, the openings 134*a*-134*n* may be configured to extend through the top layer 120 and the dielectric layer 162 to the openings 172*a*-172*n* on the middle layer 122 and then extend through middle layer 122 and the dielectric layer 164 to the lower layer 124. In the example shown, the openings 170*a*-170*k* may be configured to extend through the middle layer 122 and the dielectric layer 164 to the lower layer 124.

In the dielectric layer 162 may comprise a material configured to provide insulation between the top layer 120 and the middle layer 122. In one example, the dielectric layer 162 may comprise a RO3003 type material. In an example, the dielectric layer 162 may be implemented using a laminate that may be a ceramic-filled PTFE composite with a dielectric constant (DK) of approximately 3.00. The dielectric layer 162 may be approximately 5 mil (e.g., 0.127 mm) in thickness. Details of the top layer 120 may be described in association with FIG. 4.

The dielectric layer 164 may comprise a material configured to provide insulation between the middle layer 122 and the lower layer 124. In one example, the dielectric layer 164 may comprise a FR4 type material. In an example, the dielectric layer 164 may be implemented using a laminate that may be a glass-reinforced epoxy with a DK of approximately 3.9-5.0. The dielectric layer 164 may be approximately 0.3 mm in thickness. Details of the middle layer 122 may be described in association with FIG. 5.

Generally, the dielectric layer 162 and/or the dielectric layer 164 may be implemented using any type of PCB material. The thickness of the dielectric layer 162 and/or the dielectric layer 164 may be implemented based on the DK of the PCB material(s) selected. The type of materials selected, the combination of the materials selected and/or the thickness of the materials selected for the dielectric layer 162 and/or the dielectric layer 164 may be varied according to the design criteria of a particular implementation.

The lower layer 124 may be a ground for the PCB 102. For example, the lower layer 124 may be entirely a copper ground. In an example, the lower layer 124 may be a solid copper layer.

A reference scale 180 is shown. The reference scale 180 may show a measurement of 1.5 mm and 3 mm. In the example shown, the PCB 102 may be less than 1.5 mm in total thickness.

Figure 4:
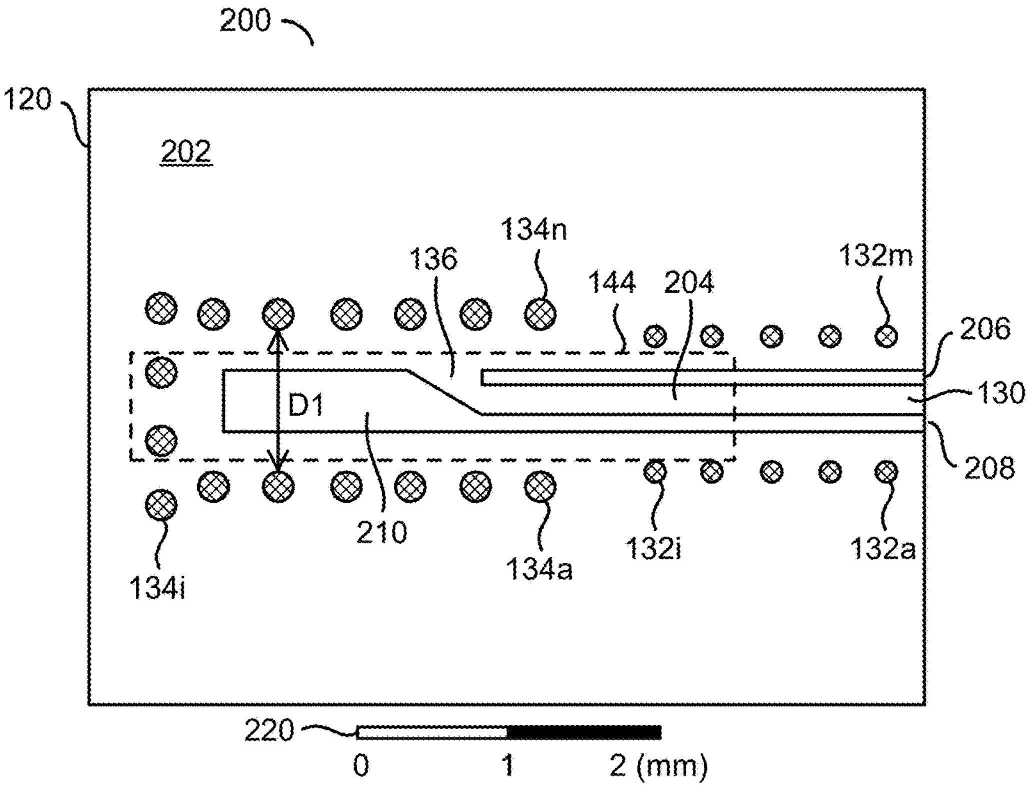
FIG. 4 is a diagram illustrating a vertical transition on a layer of a printed circuit board.

Referring to FIG. 4, a diagram illustrating a vertical transition on a layer of a printed circuit board is shown. A top down view 200 of the top layer 120 is shown. In the top down view 200, the top layer 120 is shown without the waveguide board 104 located on top. The location of the air waveguide aperture 144 is shown.

The top layer 120 may comprise the input 130, the openings 132*a*-132*m* and the openings 134*a*-134*n*. The top layer 120 may comprise a material 202. The material 202 of the top layer 120 may be copper. The top layer 120 may further comprise a metal strip 204, a strip gap 206, a strip gap 208 and a transition gap 210.

The metal strip 204 may be configured to transmit the RF signal received at the input 130 to the transition 136. For example, the metal strip 204 may be a trace on the PCB 102. The strip gap 206 may be a gap that runs along one side of the metal strip 204. The strip gap 208 may be another gap that runs along the other side of the metal strip 204. The strip gap 206 may extend along the metal strip until the reaching the transition 136. The strip gap 208 may extend along the metal strip 204 and may extend into the transition gap 210 at the transition 136. The transition gap 210 may be a gap that provides a space around the transition 136. The strip gap 206, the strip gap 208 and the transition gap 210 may each comprise a substrate material configured as an electrical insulator for the PCB 102.

The metal strip 204 may be implemented as a straight line from the input 130 to the transition 136. The metal strip 204 may comprise a trace route for the RF signal. The trace route for the metal strip 204 may be configured as a straight path without a bend and/or without a fan-out of traces. Implementing the metal strip 204 as a straight line without a bend and/or fan-out may limit a length of the metal strip 204. Limiting the length of the metal strip 204 may prevent EM losses and/or radiation. Limiting the trace route length of the metal strip 204 may enable the transition 136 to transmit the RF signal to air waveguide aperture 144 and to the waveguide 140 after a short transmission distance on the metal strip 204 to enable more of the trace route to be implemented in the waveguide board 104 than on the metal strip 204.

The openings 132*a*-132*m* may be arranged around the metal strip 204. In the example shown, five of the openings 132*a*-132*m* may be arranged along each side of the length of the metal strip 204. For example, five of the openings 132*a*-132*m* may be implemented along the strip gap 208 near the input 130 and five of the openings 132*a*-132*m* may be implemented along the strip gap 206 near the input 130. The openings 132*a*-132*m* may be an opening on the top layer 120 for a blind hole. The blind holes implemented at the openings 132*a*-132*m* may be a via that connects the top layer 120 and the middle layer 122 (as shown in association with FIG. 3). For example, the blind hole openings 132*a*-132*m* may be a hole for a CPW. The blind hole openings 132*a*-132*m* may be copper plated and extend through the dielectric layer 162. A diameter of the blind hole openings 132*a*-132*m* may be a non-critical value that may be selected according to a board fabricator. In one example, the blind hole openings 132*a*-132*m* may be approximately 0.15 mm in diameter. The number, size and/or arrangement of the openings 132*a*-132*m* may be varied according to the design criteria of a particular implementation.

The openings 134*a*-134*n* may be arranged around the transition 136 and the transition gap 210. In the example shown, six of the openings 134*a*-134*n* may be arranged along each side of the transition 136 and four of the openings 134*a*-134*n* may be arranged on along a width of the transition gap 210 (e.g., generally across from the input 130). For example, six of the openings 134*a*-134*n* may be implemented along the strip gap 208 and the transition gap 210 (e.g., starting from a location near the middle of the top layer 120), six of the openings 134*a*-134*n* may be implemented along the strip gap 206, the transition 136 and the transition gap 210 (e.g., starting from a location near the middle of the top layer 120), and four of the openings 134*a*-134*n* may be implemented perpendicular to the pairs of six openings 134*a*-134*n*.

The openings 134*a*-134*n* may be an opening on the top layer 120 for a through hole that may extend through each of the layers of the PCB 102 (e.g., through at least the top layer 120, the dielectric layer 162, the middle layer 122, the dielectric layer 164 and the lower layer 124). The through holes implemented at the openings 134*a*-134*n* may be a via that connects at least the top layer 120, the middle layer 122 and the lower layer 124 (as shown in association with FIG. 3). The through hole openings 134*a*-134*n* may be copper plated and extend through each layer of the PCB 102. A diameter of the through hole openings 134*a*-134*n* may be a non-critical value that may be selected according to a board fabricator. The through hole openings 134*a*-134*n* may have a larger diameter than the blind hole openings 132*a*-132*m*. In one example, the through hole openings 134*a*-134*n* may be approximately 0.2 mm in diameter. The number, size and/or arrangement of the openings 134*a*-134*n* may be varied according to the design criteria of a particular implementation.

A distance D1 is shown. The distance D1 may be a measurement of the distance between the openings 134*a*-134*n* on either side of the transition 136 and/or the transition gap 210. In the example shown, the distance D1 may be approximately 1.3 mm.

A location of where the air waveguide aperture 144 fits over the top layer 120 is shown. The air waveguide aperture 144 may fit over top of the transition 136 and the transition gap 210. The input to the bottom of the air waveguide 140 may generally be located with the openings 132*a*-132*m* and/or the openings 134*a*-134*n* outside of the air waveguide aperture 144. For example, two of the openings 134*a*-134*n* along the transition gap 210 may be located under the air waveguide aperture 144. In the example shown, four of the openings 132*a*-132*m* may be located under the waveguide board 104 and all of the openings 134*a*-134*n* may be located under the waveguide board 104.

The transition 136 may be implemented as a taper shape. The taper shape of the transition 136 may provide an angled connection from the metal strip 204 to the copper material 202 of the top layer 120. In an example, the transition 136 may be a taper from the CPW to the air waveguide board 104. The transition 136 may enable a half-mode excitation for transmitting the RF signal from the PCB 102 (e.g., the metal strip 204) and the waveguide board 104. Instead of implementing a signal feed using a differential line with a phase difference of 180 degrees between the two lines (e.g., mirroring the length of the strip gap 208 and the transition gap 210 and implementing two metal strips), the feed from the input 130 to the transition 136 may implement the single metal strip 204. The single metal strip 204 may be implemented by shunting another line directly as ground. Shunting one line directly to ground (e.g., using the through hole openings 134*a*-134*n* to the solid copper ground of the lower layer 124) may provide an excitation phase difference of 90 degrees (e.g., the half-mode excitation).

A reference scale 220 is shown. The reference scale 220 may show a measurement of 1 mm and 2 mm. In the example shown, the metal strip 204 may be approximately 3 mm in length and have a width of less than 1.3 mm (e.g., the metal strip 204 may be narrower than the transition gap 210). The openings 132*a*-132*m* may extend along approximately a 2 mm length beside the strip gaps 206-208. The openings 134*a*-134*n* may extend along approximately a 2 mm length beside the transition 136, the strip gaps 206-208, the transition gap 210. The air waveguide aperture 144 may have a width that may be less than 1 mm.

Figure 5:
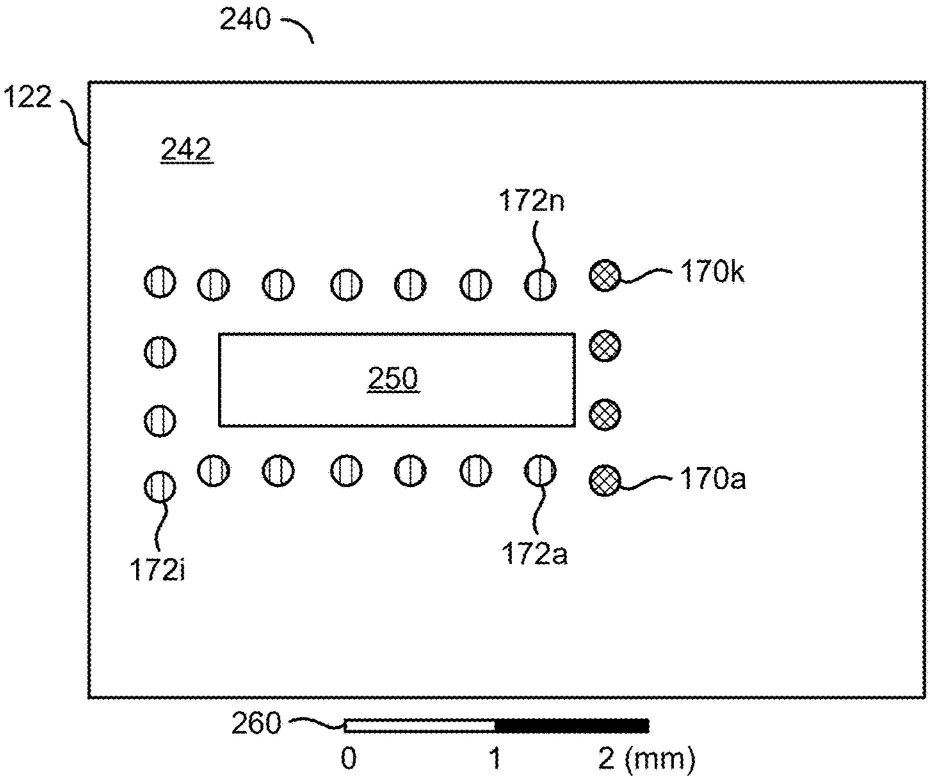
FIG. 5 is a diagram illustrating an aperture on a layer of a printed circuit board.

Referring to FIG. 5, a diagram illustrating an aperture on a layer of a printed circuit board is shown. A top down view 240 of the middle layer 122 is shown. In the top down view 240, the middle layer 122 is shown without the waveguide board 104, the top layer 120 and/or the dielectric layer 162 located on top.

The middle layer 122 may comprise the openings 170*a*-170*k*, the openings 172*a*-172*n*, a material 242 and/or an aperture 250. The material 242 of the middle layer 122 may be copper. The openings 172*a*-172*n* and/or the openings 170*a*-170*k* may surround the aperture 250.

The openings 172*a*-172*n* may be arranged in a similar spatial arrangement as the openings 134*a*-134*n* of the top layer 120. The openings 172*a*-172*n* may be aligned with the through hole openings 134*a*-134*n*. The openings 172*a*-172*n* may be openings for the through holes that extends from the openings 134*a*-134*n* to the openings 172*a*-172*n* and/or to other layers of the PCB 102. For example, the through holes with the openings 134*a*-134*n* may extend through to the openings 172*a*-172*n* and then to at least the lower layer 124 in order to implement a transition via that may extend through each of the layers of the PCB 102 (e.g., through at least the top layer 120, the dielectric layer 162, the middle layer 122, the dielectric layer 164 and the lower layer 124). The through holes implemented at the openings 172*a*-172*n* may be a part of the via that connects at least the top layer 120, the middle layer 122 and the lower layer 124 (as shown in association with FIG. 3). The through hole openings 172*a*-172*n* may be copper plated and extend through each layer of the PCB 102. A diameter of the through hole openings 172*a*-172*n* may be a non-critical value that may be selected according to a board fabricator. In one example, the through hole openings 172*a*-172*n* may be approximately 0.2 mm in diameter. The number, size and/or arrangement of the openings 172*a*-172*n* may be similar to the openings 134*a*-134*n* and may be varied according to the design criteria of a particular implementation.

The openings 172*a*-172*n* may be located around three sides of the aperture 250. In the example shown, six of the openings 172*a*-172*n* may be located along one long side of the aperture 250 and another six of the openings 172*a*-172*n* may be located along the other long side of the aperture 250. The pairs of six of the openings 172*a*-172*n* located along the long sides of the aperture 250 may align with the pairs of six openings 134*a*-134*n* located along the metal strip 204, the transition 136 and the transition gap 210 as shown in association with FIG. 4. In the example shown, four of the openings 172*a*-172*n* may be located along one short side of the aperture 250. The four openings 172*a*-172*n* located long the short side of the aperture 250 may align with the four of the openings 134*a*-134*n* that are located along the transition gap 210 opposite to the input 130 as shown in association with FIG. 4.

The openings 170*a*-170*k* may be located around one side of the aperture 250. Generally, there may be fewer of the openings 170*a*-170*k* than the number of the openings 172*a*-172*n*. In the example shown, there may be four of the openings 170*a*-170*k*. The four openings 170*a*-170*k* may be located opposite to the four of the openings 172*a*-172*n* located along one short side of the aperture 250. The openings 170*a*-170*k* may be located on a side of the middle layer 122 that is closer to the input 130 of the PCB 102.

The openings 170*a*-170*k* may be openings for a blind hole. For example, the openings 170*a*-170*k* may provide a blind via from the middle layer 122 to at least the lower layer 124 (as shown in association with FIG. 3). In embodiments that comprise more layers beyond the lower layer 124, the blind hole openings 170*a*-170*k* may extend the blind via from the middle layer 122 to the bottommost layer. The blind hole openings 170*a*-170*k* may be copper plated and extend through the dielectric layer 164. A diameter of the blind hole openings 170*a*-170*k* may be a non-critical value that may be selected according to a board fabricator. In the example shown, the blind hole openings 170*a*-170*k* may have a similar diameter as the through hole openings 172*a*-172*n*. In one example, the blind hole openings 170*a*-170*k* may be approximately 0.2 mm in diameter. The number, size and/or arrangement of the openings 170*a*-170*k* may be varied according to the design criteria of a particular implementation.

The aperture 250 may be implemented having a rectangular shape. The rectangular shape of the aperture may comprise two short sides (e.g., one located next to the four of the openings 172*a*-172*n* and one located next to the blind openings 170*a*-170*k*) and two long sides (e.g., each located next to a group of six of the openings 172*a*-172*n*).

The aperture 250 may be configured as a back-short cavity. The aperture 250 may form the back-short cavity in the dielectric layer 164 (e.g., the FR4 material). Implementing the aperture 250 to create the back-short cavity may enable a greater bandwidth for the transition 136.

A reference scale 260 is shown. The reference scale 260 may show a measurement of 1 mm and 2 mm. In the example shown, the aperture 250 may be approximately 2 mm in length on the long sides and have a length of less than 1 mm along the short sides. The short sides of the aperture 250 may have a length similar to the width of the transition gap 210 of the top layer 120. The middle layer 122 may be approximately the same size as the top layer 120. The lower layer 124 may be approximately the same size as the top layer 120 and the middle layer 122. For example, the lower layer 124 may be similar to the top layer 120 and/or the middle layer 122 but implemented as a solid copper layer (e.g., implemented without the aperture 250 and/or gaps).

The design of the transition 136 may have a compact size (e.g., less than 1.3 mm). The compact size of the transition 136 may enable multiple transitions to be placed side by side with shared vias and connect with RF ports of an MMIC without bending fan-out traces (to be described in association with FIG. 8). By keeping the metal strip 204 short, the trace length on the PCB 102 may be kept to a small distance (e.g., for less lossy transmission compared to transmission in the waveguide 140). For example, most of the routing trace of the apparatus 100 may be in the air waveguide 140 to prevent RF loss. The through hole openings 134*a*-134*n* (and the through hole openings 172*a*-172*n*) and the blind hole openings 132*a*-132*m* may be implemented in an arrangement configured to limit the routing length (e.g., the length of the metal strip 204) on the PCB 102 to enable a routing length in the waveguide board 104 to be comparatively longer. The arrangement of the through hole openings 134*a*-134*n*, the through hole openings 172*a*-172*n*, the blind hole openings 132*a*-132*m* and the blind hole openings 170*a*-170*k* may comprise a compact layout with shared vias placed side by side to enable the metal strip 204 to be implemented without a fan-out of traces. The waveguide 140 may be excited to generate an E-field between two walls of the waveguide 140. For example, the combination of the side-by-side shared vias, the taper of the transition 136 on the top layer 120 and the aperture 250 may enable the vertical transition from the PCB 102 to the waveguide board 104 and the generation of the E-field using half-mode excitation.

Figure 6:
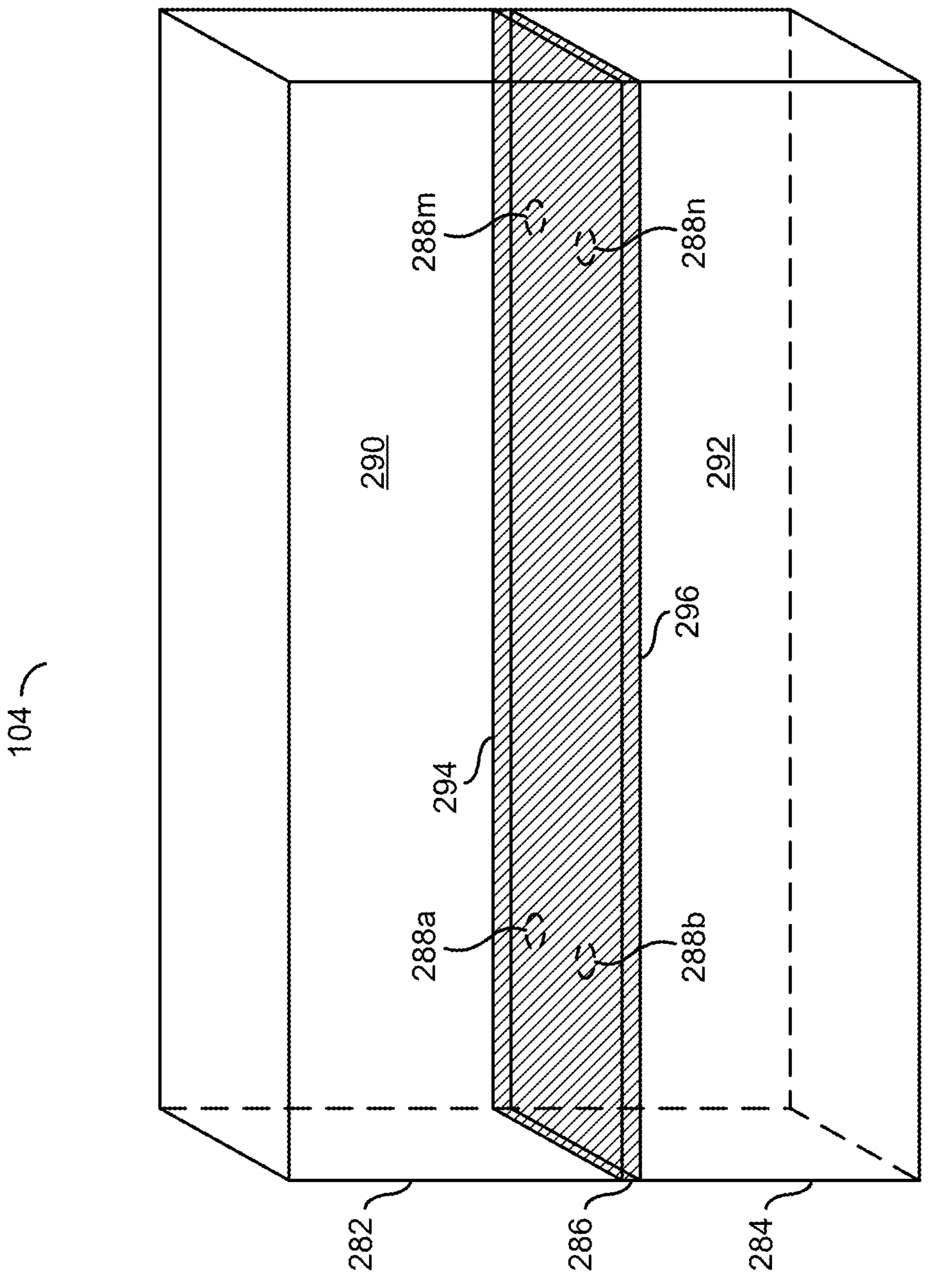
FIG. 6 is a diagram illustrating a two layer embodiment of the waveguide board.

Referring to FIG. 6, a diagram illustrating a two layer embodiment of the waveguide board is shown. The waveguide board 104 is shown. The waveguide board 104 may be a representative example of one of the waveguide boards implemented in the apparatuses 100*a*-100*e* shown in association with FIG. 1. The waveguide board 104 may be configured as a waveguide feeding network. The waveguide board 104 may enable an adjustment of an amplitude and/or phase of each radiation element in the waveguide feeding network. Adjusting the amplitude and/or phase of each radiation element may enable a high gain, directional beam with a low side lobe to be achieved in an antenna array.

The waveguide board 104 may comprise a first portion 282, a second portion 284, an air gap 286, attachments 288*a*-288*n*, a first waveguide board layer 290 and a second waveguide board layer 292. The first portion 282 and the second portion 284 may comprise two pieces of the waveguide board 104. The first portion 282 may be a top piece. The second portion 284 may be a bottom piece. In an example, the air gap 286 may have a tolerance of approximately 1 mil to 2 mil for an air gap in between the first portion 282 and the second portion 284. For example, a cut may be made in the middle of a whole waveguide in order to provide the first portion 282 and the second portion 284 with the air gap 286 in the middle. The waveguide board 104 may be configured as a waveguide-fed horn integrated into the two layer waveguide board 104. The waveguide board 104 may be configured to provide an ultra wide bandwidth with high radiation efficiency for more than 10 GHz.

The waveguide board 104 may be designed for mass production. For example, the waveguide board 104 may implement a waveguide for each of the radar sensors 52*a*-52*e* in the vehicle 50. Dividing a waveguide board 104 into two pieces (e.g., the first portion 282 and the second portion 284) may reduce production costs. The first portion 282 may be fabricated with the first waveguide board layer 290 and the second portion 284 may be fabricated with the second waveguide board layer 292. The first waveguide board layer 290 and the second waveguide board layer 292 may be fabricated using molding injection with surface plating. The attachments 288*a*-288*n* may be configured to attach the first portion 282 to the second portion 284.

The attachments 288*a*-288*n* may connect the first portion 282 to the second portion 284. In some embodiments, the attachments 288*a*-288*n* may comprise a fastener (e.g., a screw). In the example shown, four fasteners are implemented as the attachments 288*a*-288*n*. In some embodiments, the attachments 288*a*-288*n* may comprise a conductive glue. In some embodiments, the attachments 288*a*-288*n* may comprise a non-conductive glue. Since the air gap 286 is in the middle of the first portion 282 and the second portion 284, an amount of leakage may be limited to a small amount from the bonding gap due to a low current. For example, with the 2 mil thickness air gap 286 between the first portion 282 and the second portion 284, an amount of loss for the waveguide board 104 may be similar to an amount of loss in a single-piece waveguide. The type, material and/or the location of the attachments 288*a*-288*n* implemented may be varied according to the design criteria of a particular implementation.

The two-layer board 290-292 is shown. The two-layer board 290-292 may implement the two-layer waveguide board 104. The first portion 282 may comprise the first half 290 of the two-layer waveguide board 104. The second portion 284 may comprise the second half 292 of the two-layer waveguide board 104. Surfaces 294-296 are shown. The surface 294 may comprise a conductive surface for the first half 290 of the two-layer waveguide board 104. The surface 296 may comprise a conductive surface for the second half 292 of the two-layer waveguide board 104. In an example, the two-layer board 104 may be implemented (e.g., filled) with a first material, and comprise a second material for the surfaces 294-296.

The first portion 282 may be a first waveguide portion. The first portion 282 may comprise a first half of a waveguide input. The second portion 284 may be a second waveguide portion. The second portion 284 may comprise a second half of a waveguide input. In some embodiments, a height of the first portion 282 may be approximately the same height as the second portion 284. In an example, in an ideal assembly for the waveguide board 104, the first portion 282 may be connected to the second portion 284 without the air gap 286. If there is no air gap 286, then the height of the first portion 282 may not necessarily be the same height as the second portion 284. In a real world assembly, the presence of the air gap 286 may be unavoidable. Implementing the first portion 282 with the same height as the second portion 284 may limit leakage of the RF energy transmitted in the waveguide 140.

The air waveguide 140 may be carved into the material of the first waveguide board layer 290 and the second waveguide board layer 292. The air waveguide 140 may be bounded by the material of the surfaces 294-296. For example, the air waveguide 140 may be a cavity in the material of the first waveguide board layer 290 and the second waveguide board layer 292 and the edges of the air waveguide 140 may be covered with the metal plating of the surfaces 294-296. The transition 136 may enable the RF signal to be transmitted into the air waveguide aperture 144 at the second (e.g., bottom) portion 284 and the RF signal may be transmitted out of the air waveguide 140 at the output 142 at the first (e.g., top) portion 282. Details of the waveguide board 104 may be described in association with U.S. patent application Ser. No. 17/945,379, filed on Sep. 15, 2022, appropriate portions of which are incorporated by reference.

Figure 7:
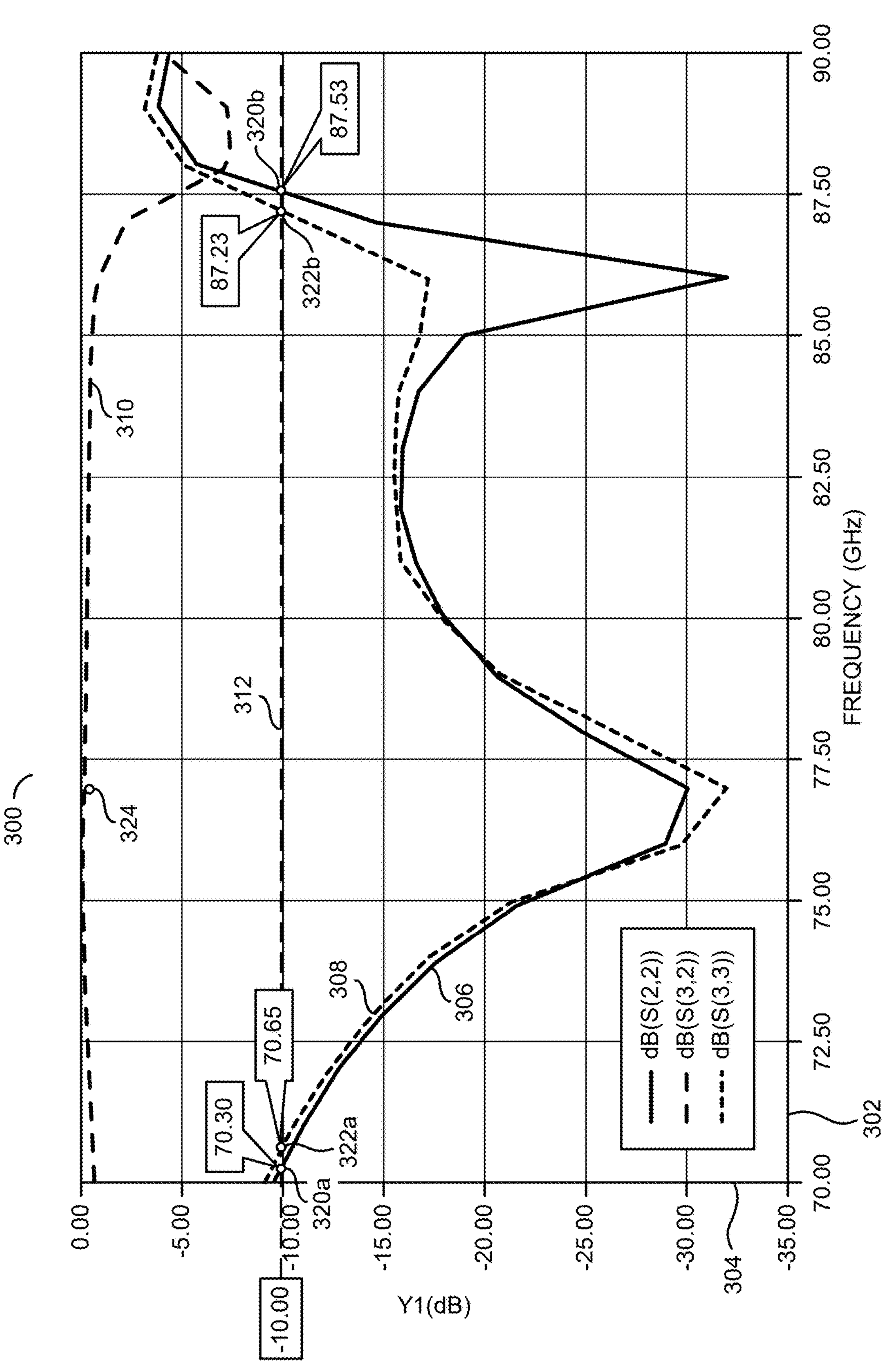
FIG. 7 is a diagram illustrating a reflection coefficient plot for an example embodiment of the present invention.

Referring to FIG. 7, a diagram illustrating a reflection coefficient plot for an example embodiment of the present invention is shown. A graph 300 is shown. The graph 300 may illustrate a reflection coefficient plot and/or an insertion loss plot of an example embodiment of the apparatus 100. In an example, the graph 300 may correspond to the apparatus 100 shown in association with FIG. 2.

The graph 300 may comprise an axis 302 and an axis 304. The axis 302 may comprise an x-axis. The axis 304 may comprise a y-axis. The x-axis 302 may be a measure of frequency. In the example shown, the x-axis 302 may comprise a range of frequency from approximately 70 GHz to 90 GHz. The y-axis 304 may be a measure of a reflection coefficient. In the example shown, the y-axis 304 may comprise a range of reflection coefficients from approximately 0 dB to −35 dB. In an example, the reflection coefficient may provide a relationship between the RF wave at the waveguide output 142 and the input feeding 130.

A line 306, a line 308 and a line 310 are shown on the graph 300. The lines 306-308 may each be a reflection coefficient plot of the RF wave that may propagate through the PCB 102 and the air waveguide 140. The line 306 may be the reflection coefficient plot of the RF wave at a CPW port (e.g., the input 130). The line 308 may be the reflection coefficient plot of the RF wave at the waveguide output 142. The line 310 may correspond to the insertion loss of the waveguide output 142.

A dashed horizontal line 312 is shown. The dashed horizontal line 312 may comprise a reference line for a −10 dB reflection coefficient. In an example, −10 dB may be considered an operational range for the apparatus 100. The reference line 312 may define where the apparatus 100 is considered operational. The operational range for the apparatus 100 may be varied according to the design criteria of a particular implementation.

Points 320*a*-320*b* are shown on the reflection coefficient plot 306. The points 320*a*-320*b* may be locations on the reflection coefficient plot 306 that intersect with the −10 dB reference line 312. The point 320*a* may indicate that the reflection coefficient plot 306 has a reflection coefficient of −10 dB at approximately 70.30 GHz. For frequencies below 70.30 GHz, the reflection coefficient plot 306 for the apparatus 100 may be greater than −10 dB. The point 320*b* may indicate that the reflection coefficient plot 306 has a reflection coefficient of −10 dB at approximately 87.53 GHz. For frequencies above 87.53 GHz, the reflection coefficient plot 306 for the apparatus 100 may be greater than −10 dB. The reflection coefficient plot 306 may be less than −10 dB in between the frequencies 70.30 GHz and 87.53 GHz. For example, the bandwidth of the apparatus 100 may be approximately 17.23 GHz.

Points 322*a*-322*b* are shown on the reflection coefficient plot 307. The points 322*a*-322*b* may be locations on the reflection coefficient plot 308 that intersect with the −10 dB reference line 312. The point 322*a* may indicate that the reflection coefficient plot 308 has a reflection coefficient of −10 dB at approximately 70.65 GHz. For frequencies below 70.65 GHz, the reflection coefficient plot 308 for the apparatus 100 may be greater than −10 dB. The point 322*b* may indicate that the reflection coefficient plot 308 has a reflection coefficient of −10 dB at approximately 87.23 GHz. For frequencies above 87.23 GHz, the reflection coefficient plot 308 for the apparatus 100 may be greater than −10 dB. The reflection coefficient plot 308 may be less than −10 dB in between the frequencies 70.65 GHz and 87.23 GHz. For example, the bandwidth of the apparatus 100 may be approximately 16.58 GHz. Generally, the reflection coefficient plot 308 at the output 142 may be similar to the reflection coefficient plot 306 at the input 130.

A point 324 is shown on the insertion loss plot 310. The point 340 on the insertion loss plot 310 may correspond to 77 GHz on the x-axis 302 and approximately-0.3747 dB on the y-axis 304. The insertion loss plot 310 may be generally close to the value-0.3747 dB and then drop lower near approximately 86 GHz.

The apparatus 100 may be configured to perform with a wide bandwidth (e.g., approximately 17 GHz of bandwidth and potentially beyond 20 GHz). The wide bandwidth may provide good performance under the fabrication tolerance. The apparatus 100 may have a low insertion loss. In an example, the insertion loss may be approximately −0.3 dB to −0.4 dB near 76 GHz-77 GHz. For example, a worst loss may be −0.8 dB in the 17 GHz band.

Figure 8:
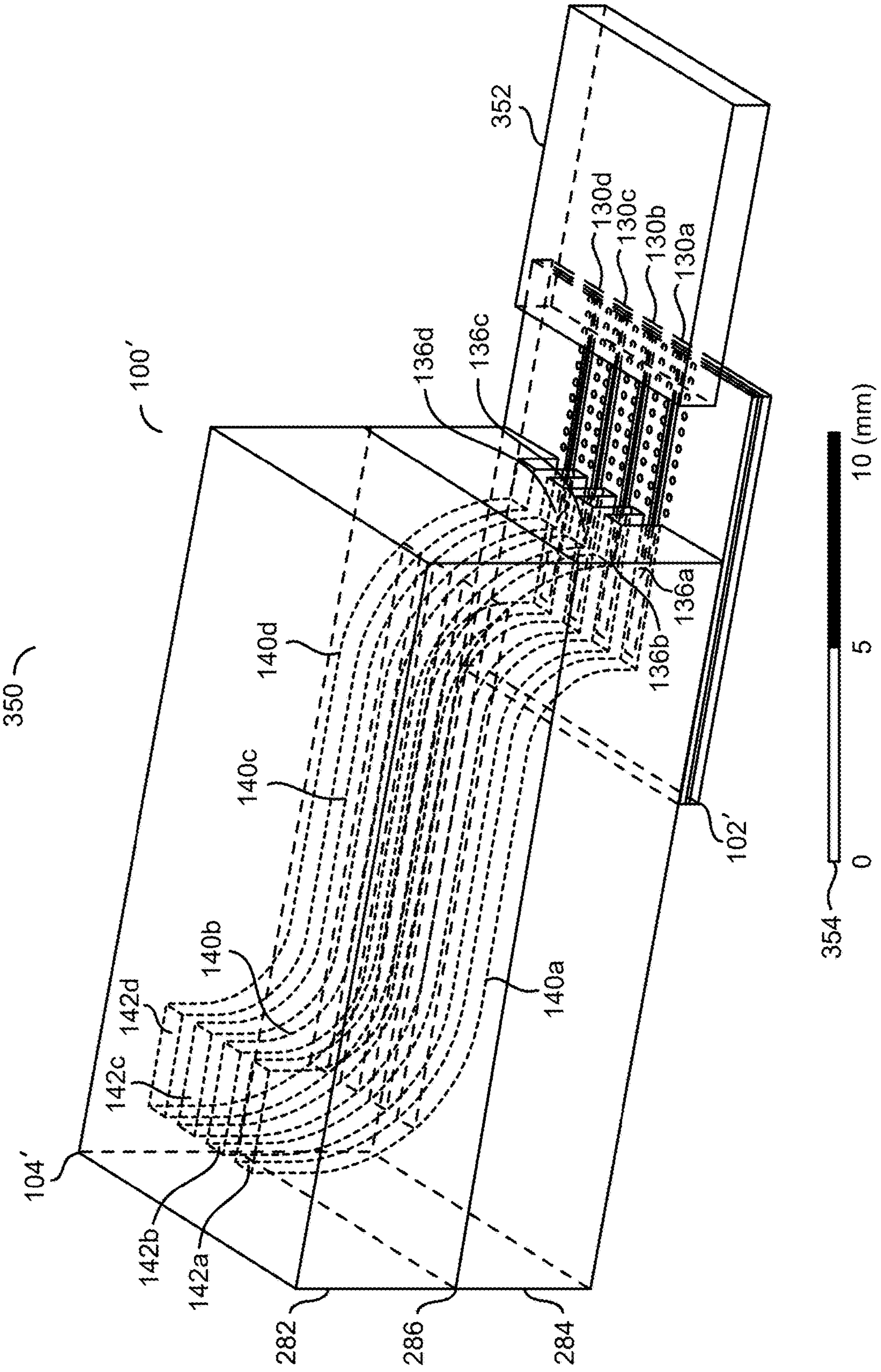
FIG. 8 is a diagram illustrating multiple vertical transitions from a printed circuit board to a two-layer air waveguide.

Referring to FIG. 8, a diagram illustrating multiple vertical transitions from a printed circuit board to a two-layer air waveguide is shown. A perspective view 350 of the apparatus 100' is shown. The apparatus 100' may be configured to implement multiple waveguide channels.

The apparatus 100' may comprise the PCB 102', the waveguide board 104' and/or a block (or circuit) 352. The circuit 352 may implement a MMIC. The MMIC 352 may be configured to generate one or more RF signals. The MMIC 352 may present the RF signals to the PCB 102' from RF ports. The PCB 102' may transmit the RF signal from the MMIC 352 to the waveguide board 104'. The waveguide board 104' may emit the RF signal.

In some embodiments, the waveguide board 104' may be configured to implement one or more of the air waveguide apertures **144*a*-144*d* (not shown but each implemented similarly to the air waveguide aperture 144 shown in association with FIG. 2) for a stick-on antenna board. In some embodiments, the waveguide board 104' may be configured to implement an integrated waveguide antenna. The waveguide board 104' may be the two-layer waveguide board as shown in association with FIG. 6. For example, the waveguide board 104' may comprise the top portion 282, the bottom portion 284 and the air gap 286**.

The PCB 102' may comprise the layers 120-124. The PCB 102' may comprise multiple inputs **130*a*-130*d*. The multiple inputs 130*a*-130*d* may each receive a RF signal from a respective RF port of the MMIC 352. For example, the MMIC 352 may be configured to present an RF signal to each of the inputs 130*a*-130*d*. In the example shown, the PCB 102' may comprise four of the inputs 130*a*-130*d*. The inputs 130*a*-130*d* are each implemented on a same side of the PCB 102'. For example, the multiple inputs 130*a*-130*d* may be arranged to align with output pads of the MMIC 352 and provide a straight line path along the respective metal strips 204*a*-204*d* (not shown) without a bend and/or fan-out. The number of the multiple inputs 130*a*-130*d* implemented and/or the arrangement of the multiple inputs 130*a*-130*d*** may be varied according to the design criteria of a particular implementation.

The PCB 102' may comprise multiple transitions **136*a*-136*d*. The multiple transitions 136*a*-136*d* may each comprise a vertical transition similar to the transition 136 described in association with FIGS. 2-5. The multiple transitions 136*a*-136*d* may each be configured to receive the RF signal from a respective one of the multiple inputs 130*a*-130*d*. The multiple transitions 136*a*-136*d* may be configured to transfer the RF signals from the PCB 102' up to the waveguide board 104' through the air waveguide apertures 144*a*-144*d***.

The waveguide board 104' may be configured to implement an air waveguide feeding and/or routing. The air waveguide routing may comprise separate air waveguide routes **140*a*-140*d*. Each of the air waveguide routes 140*a*-140*d* may have a similar implementation as the air waveguide 140 described in association with FIG. 2. For example, the air waveguide routes 140*a*-140*d* may be carved out of the material of the waveguide boards 290-292 and the edges of the air waveguide routes 140*a*-140*d* may comprise the material of the surfaces 294-296 (e.g., metal plating). The waveguide board 104' may implement one of the air waveguide apertures 144*a*-144*d* connected to the air waveguide routes 140*a*-140*d* for each of the respective transitions 136*a*-136*d* and/or the respective multiple inputs 130*a*-130*d*. In the example shown, the waveguide board 104' may comprise four of the air waveguide routes 140*a*-140*d* and four of the air waveguide apertures 144*a*-144*d*. The number, shape and/or arrangement of the air waveguide routes 140*a*-140*d*** may be varied according to the design criteria of a particular implementation.

The air waveguide routes **140*a*-140*d* may be configured to receive the RF signal via the transitions 136*a*-136*d*. In an example, the vertical transitions 136*a*-136*b* may transfer the RF signal received from the MMIC 352 up through the air waveguide apertures 144*a*-144*d* to the air waveguide routes 140*a*-140*d* at the bottom portion 284. The air waveguide routes 140*a*-140*d* may enable the RF signal to be transmitted up from the bottom portion 284 up through the air gap 286 and up to the top portion 282 of the waveguide board 104'. The top portion 282 may comprise the output apertures 142*a*-142*d*. The output apertures 142*a*-142*d* may each be connected to a respective one of the air waveguide routes 140*a*-140*d*. The output apertures 142*a*-142*d* may each have a similar implementation as the output aperture 142 described in association with FIG. 2. The output apertures 142*a*-142*d* may transmit the RF signals out of the apparatus 100'**.

A reference scale 354 is shown. The reference scale 354 may show a measurement of 5 mm and 10 mm. In the example shown, the PCB 102 may be approximately 10 mm-12 mm. The MMIC 352 may be approximately 5 mm to 6 mm.

Figure 9:
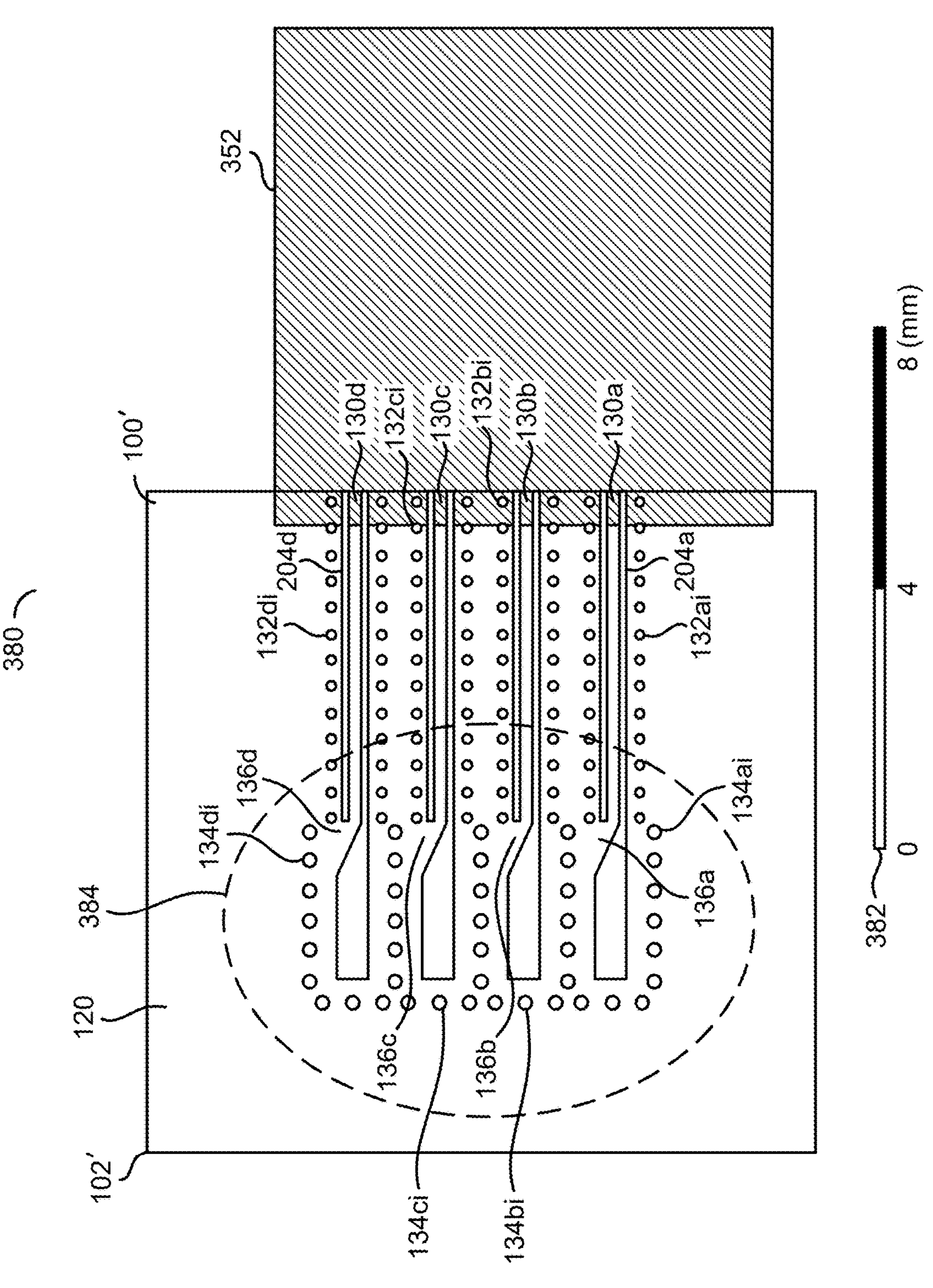
FIG. 9 is a diagram illustrating a top-down view of multiple vertical transitions receiving a signal from a MMIC.

Referring to FIG. 9, a diagram illustrating a top-down view of multiple vertical transitions receiving a signal from a MMIC is shown. The top-down view 380 of the apparatus 100' may comprise the PCB 102' and the MMIC 352. The apparatus 100' is shown without the waveguide board 104' attached. The top layer 120 of the PCB 102' is shown. A reference scale 382 is shown. The reference scale 382 may show a measurement of 4 mm and 8 mm.

The MMIC 352 may partially overlap the PCB 102'. The MMIC 352 may present the RF signal to the inputs **130*a*-130*d*. An opening 132*ai* is shown as a representative example of the openings 132*aa*-132*am* for the metal strip 204*a* at the input 130*a*. An opening 134*ai* is shown as a representative example of the openings 134*aa*-134*an* around the transition 136*a*. An opening 132*bi* is shown as a representative example of the openings 132*ba*-132*bm* for the metal strip 204*b* at the input 130*b*. An opening 134*bi* is shown as a representative example of the openings 134*ba*-**

134*bn* around the transition 136*b*. An opening 132*ci* is shown as a representative example of the openings 132*ca*-132*cm* for the metal strip 204*c* at the input 130*c*. An opening 134*ci* is shown as a representative example of the openings 134*ca*-134*cn* around the transition 136*c*. An opening 132*di* is shown as a representative example of the openings 132*da*-132*dm* for the metal strip 204*d* at the input 130*d*. An opening 134*di* is shown as a representative example of the openings 134*da*-134*dn* around the transition 136*d*. Each of the openings 132*aa*-132*am*, the openings 132*ba*-132*bm*, the openings 132*ca*-132*cm* and/or the openings 132*da*-132*dm* may have a similar implementation as the openings 132*a*-132*m* described in association with FIG. 4 (e.g., implement a blind via to the middle layer 122). Each of the openings 134*aa*-134*an*, the openings 134*ba*-134*bn*, the openings 134*ca*-134*cn* and/or the openings 134*da*-134*dn* may have a similar implementation as the openings 134*a*-134*n* described in association with FIG. 4 (e.g., implement a through via to at least the middle layer 122 and the lower layer 124).

A dotted shape 384 is shown. The dotted shape 384 may be around the transitions 136*a*-136*d*. The dotted shape 384 may highlight the arrangement of the transitions 136*a*-136*d*. The transitions 136*a*-136*d* may each be placed side-by-side on the top layer 120. The metal strips 204*a*-204*d* (only the metal strip 204*a* and 204*d* labeled with a reference number for clarity), may provide traces from the inputs 130*a*-130*d* (e.g., at the 4 RX ports of the MMIC 352) to the transitions 136*a*-136*d*. The traces to the transitions 136*a*-136*d* may be a straight connection without a bend or fanout. One or more of the openings 132*aa*-132*am*, the openings 132*ba*-132*bm*, the openings 132*ca*-132*cm*, the openings 132*da*-132*dm*, the openings 134*aa*-134*an*, the openings 134*ba*-134*bn*, the openings 134*ca*-134*cn* and/or the openings 134*da*-134*dn* may be shared vias implemented side-by-side. Sharing the vias may enable the traces (e.g., the metal strips 204*a*-204*d*) from the multiple inputs 130*a*-130*d* to the transitions 136*a*-136*d* to be implemented without a bend or fanout. Implementing the traces without a bend or fanout may enable a compact design to save costs for mass production of the apparatus 100' and/or enable more of the routing length to be implemented in the air waveguides 140*a*-140*d*.

Figure 10:
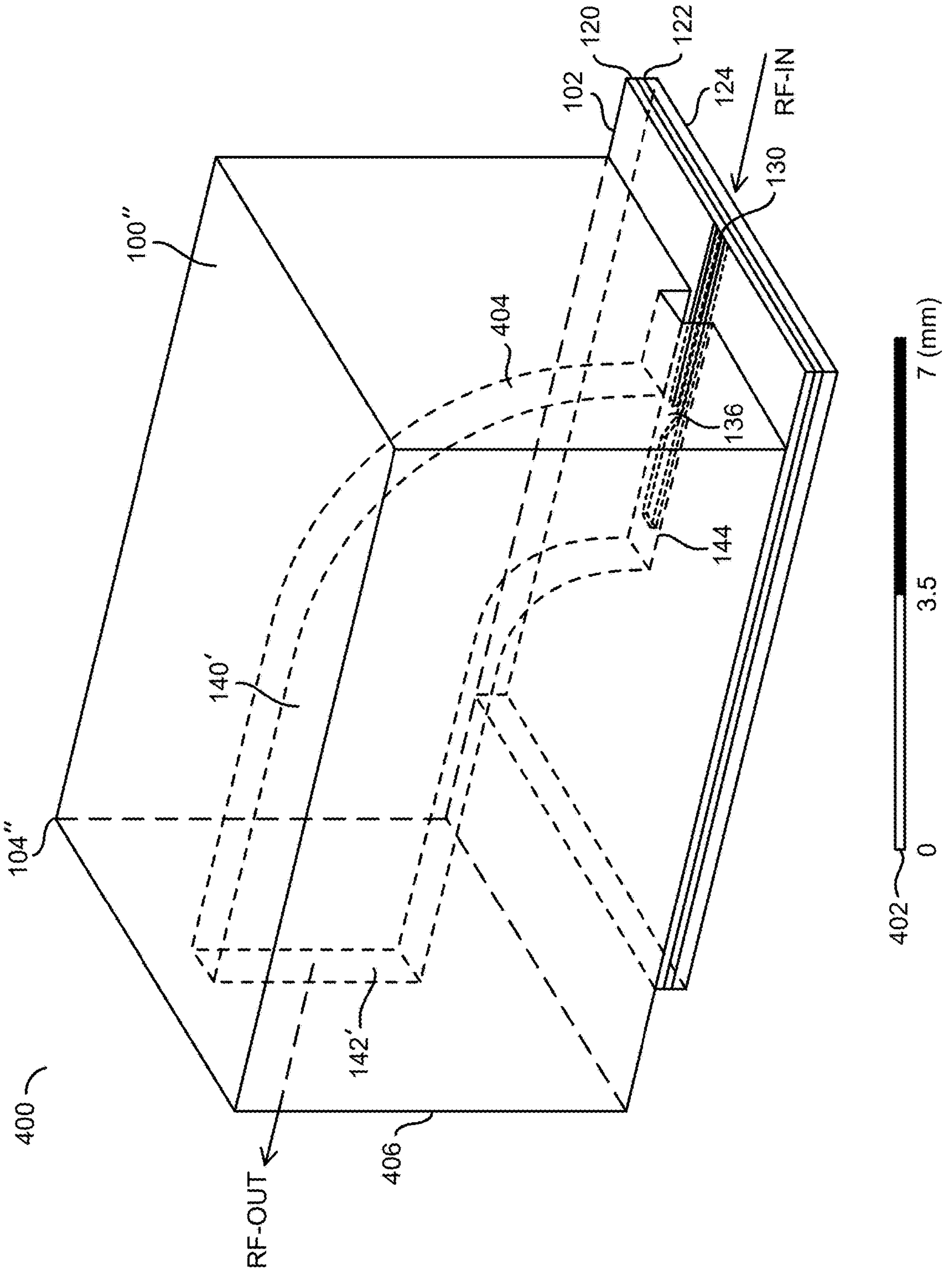
FIG. 10 is a diagram illustrating a vertical transition to a forward propagation air waveguide.

Referring to FIG. 10, a diagram illustrating a vertical transition to a forward propagation air waveguide is shown. A perspective view 400 of the apparatus 100" is shown. The apparatus 100" may be configured to implement a single channel forward propagation air waveguide. A reference scale 402 is shown. The reference scale 402 may show a measurement of 3.5 mm and 7 mm. The apparatus 100" may have a similar size as the apparatus 100 shown in association with FIG. 2.

The apparatus 100" may comprise the PCB 102 and/or the waveguide board 104". The MMIC 352 is not shown, for illustrative purposes. The PCB 102 may comprise the top layer 120, the middle layer 122 and the lower layer 124 (as well as the dielectric layer 162 and the dielectric layer 164).

A signal (e.g., RF-IN) is shown. The signal RF-IN may be an RF signal generated by the MMIC 352. The signal RF-IN may be received by the input 130. The signal RF-IN may be transmitted from the input 130 to the transition 136 (e.g., via the straight line metal strip 204 shown in association with FIG. 4). The transition 136 may provide a vertical transition to the air waveguide aperture 144 for the signal RF-IN to the waveguide board 104".

The waveguide board 104" may comprise the forward propagation air waveguide 140'. The forward propagation air waveguide 140' may receive the signal RF-IN from the transition 136 and the air waveguide aperture 144 at a bottom of the waveguide board 104" (e.g., in the bottom portion 284). The forward propagation air waveguide 140' may comprise a forward bend 404. The forward bend 404 may curve the forward propagation air waveguide 140' from an upward path from the transition 136 to a forward path. The forward path of the forward propagation air waveguide 140' may be partially through the top portion 282 and the bottom portion 284 of the waveguide board 104". The forward path of the forward propagation air waveguide 140' may terminate at the output aperture 142'.

The output aperture 142' may be located on a side surface 406 of the waveguide board 104". For example, the bend 404 may enable the forward propagation air waveguide 140' to transmit the signal RF-IN towards the side surface 406 instead of out of the top of the waveguide board 104". The output aperture 142' may be an opening formed partially through the top portion 282 and the bottom portion 284 of the waveguide board 104".

A signal (e.g., RF-OUT) is shown. The signal RF-OUT may be presented from the output aperture 142'. The signal RF-OUT may be the transmission of the input signal RF-IN out from the forward propagation air waveguide 140'. The signal RF-OUT may be transmitted out an opposite side of the waveguide board 104" from the side of the PCB 102 that received the input signal RF-IN. For example, the direction of the signal RF-IN may pass through the PCB 102 and the waveguide board 104" and may be emitted as the output signal RF-OUT in the same direction.

In the example shown, the forward propagation air waveguide 140' may be a single channel air waveguide. Similarly, a multi-channel forward propagation air waveguide may be implemented. Implementing the forward propagation air waveguide 140' may enable more flexibility for a board designer to implement short traces on the PCB 102. For example, the shorter the length of the traces, the more that insertion loss may be reduced.

Figure 11:
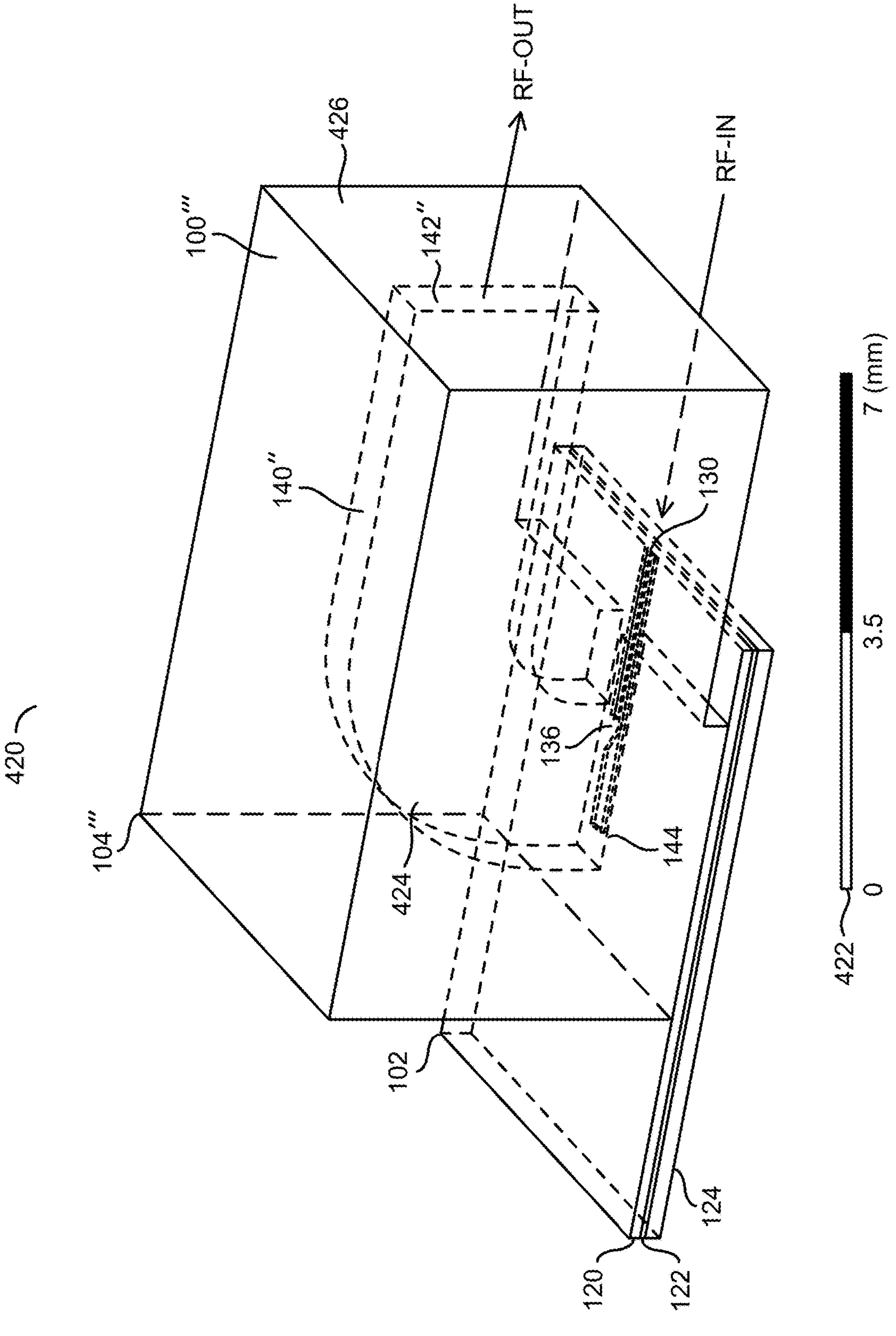
FIG. 11 is a diagram illustrating a vertical transition to a backward propagation air waveguide.

Referring to FIG. 11, a diagram illustrating a vertical transition to a backward propagation air waveguide is shown. A perspective view 420 of the apparatus 100" is shown. The apparatus 100" may be configured to implement a single channel backward propagation air waveguide. A reference scale 422 is shown. The reference scale 422 may show a measurement of 3.5 mm and 7 mm. The apparatus 100" may have a similar size as the apparatus 100 shown in association with FIG. 2.

The apparatus 100" may comprise the PCB 102 and/or the waveguide board 104". The MMIC 352 is not shown, for illustrative purposes. In an example, for the backward propagation implementation, the MMIC 352 may be located underneath the waveguide board 104". The PCB 102 may comprise the top layer 120, the middle layer 122 and the lower layer 124 (as well as the dielectric layer 162 and the dielectric layer 164).

The signal RF-IN is shown. The signal RF-IN may be an RF signal generated by the MMIC 352. The signal RF-IN may be received by the input 130. The signal RF-IN may be transmitted from the input 130 to the transition 136 (e.g., via the metal strip 204 shown in association with FIG. 4). The transition 136 may provide a vertical transition for the signal RF-IN up through the air waveguide aperture 144 to the waveguide board 104".

The waveguide board 104" may comprise the backward propagation air waveguide 140". The backward propagation air waveguide 140" may receive the signal RF-IN from the transition 136 and through the air waveguide aperture 144 at a bottom of the waveguide board 104" (e.g., in the bottom portion 284). The backward propagation air waveguide 140" may comprise a reverse bend 424. The reverse bend 424 may curve the backward propagation air waveguide 140" from an upward path from the transition 136 at the air waveguide aperture 144 to a reverse path. The reverse path of the backward propagation air waveguide 140" may be partially through the top portion 282 and the bottom portion 284 of the waveguide board 104". The reverse path of the backward propagation air waveguide 140" may terminate at the output aperture 142".

The output aperture 142" may be located on a side surface 426 of the waveguide board 104". For example, the reverse bend 424 may enable the backward propagation air waveguide 140" to transmit the signal RF-IN towards the side surface 426 instead of out of the top of the waveguide board 104". The output aperture 142" may be an opening formed partially through the top portion 282 and the bottom portion 284 of the waveguide board 104".

The signal RF-OUT is shown. The signal RF-OUT may be presented from the output aperture 142". The signal RF-OUT may be the transmission of the input signal RF-IN out from the backward propagation air waveguide 140". The signal RF-OUT may be transmitted out of the same side of the waveguide board 104" from the side of the PCB 102 that received the input signal RF-IN. For example, the direction of the signal RF-IN may pass through the PCB 102 and the waveguide board 104" and may be emitted as the output signal RF-OUT in an opposite direction. The backward propagation air waveguide 140" may send the signal RF-OUT out of the waveguide board 104" over the MMIC 352.

In the example shown, the backward propagation air waveguide 140" may be a single channel air waveguide. Similarly, a multi-channel backward propagation air waveguide may be implemented. Implementing the backward propagation air waveguide 140" may enable more flexibility for a board designer to implement short traces on the PCB 102 (e.g., for reduced insertion loss). In particular, the backward propagation air waveguide 140" may pass over top of the MMIC 352, in order to make use of the empty space above the MMIC 352.

The functions performed by the diagrams of FIGS. 1-11 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   - a coplanar waveguide input (i) comprising a vertical transition to a waveguide and (ii) configured to transmit an output from a circuit to said waveguide;
   - a transition gap implemented next to said coplanar waveguide input;
   - a metal strip configured to extend from an input of said apparatus to said coplanar waveguide input;
   - a first strip gap configured to extend along a first side of said metal strip until being blocked from reaching into said transition gap by an angled connection of said coplanar waveguide input to said apparatus;
   - a second strip gap configured to extend along a second side of said metal strip and into said transition gap, wherein said second strip gap is separate from said first strip gap;
   - a plurality of first through via openings each configured to provide a through via between said apparatus, an intermediate layer and a ground layer; and
   - a plurality of first blind via openings each configured to provide a blind via from said apparatus to said intermediate layer.

2. The apparatus according to claim 1, wherein (i) said intermediate layer comprises a plurality of second through via openings, a plurality of second blind via openings and an aperture, (ii) said second through via openings provide said through via and (iii) said plurality of second blind via openings provide a blind via from said intermediate layer to said ground layer.

3. The apparatus according to claim 2, wherein said aperture is a rectangular shape configured to create a backshort cavity.

4. The apparatus according to claim 1, wherein said apparatus is a layer of a printed circuit board configured to provide said vertical transition from said coplanar waveguide input to an air waveguide using half-mode excitation.

5. The apparatus according to claim 1, wherein (i) said coplanar waveguide input is configured to receive said output from said circuit comprising a radio frequency signal, (ii) said waveguide is configured to output said radio frequency signal and (iii) said vertical transition is configured to transmit said radio frequency signal into said waveguide vertically.

6. The apparatus according to claim 1, wherein (i) said waveguide is an air waveguide and (ii) said air waveguide comprises a waveguide aperture with a width of less than 1 mm.

7. The apparatus according to claim 1, wherein said apparatus is implemented on a bottom of a two-layer waveguide board.

8. The apparatus according to claim 7, wherein (i) said two-layer waveguide board comprises (a) a first waveguide portion comprising a first half of a waveguide input, (b) a second waveguide portion comprising a second half of said waveguide input, and (c) an attachment configured to connect said first waveguide portion to said second waveguide portion, (ii) said apparatus is implemented on a bottom of said second waveguide portion and (iii) a horn antenna aperture is implemented on a top of said first waveguide portion.

9. The apparatus according to claim 7, wherein said vertical transition is configured to enable launching of said output from said circuit to said two-layer waveguide board in at least one of (i) a forward propagation configuration and (ii) a backward propagation configuration.

10. The apparatus according to claim 1, wherein (i) said apparatus further comprises one or more additional coplanar waveguide inputs, (ii) each of said additional coplanar waveguide inputs comprise said vertical transition to said waveguide and (iii) said coplanar waveguide input and said additional coplanar waveguide inputs are configured to be routed to a plurality of air waveguide apertures of said waveguide implementing a multi-input multi-output antenna configuration.

11. The apparatus according to claim 1, wherein (i) said first through via openings and said first blind via openings are implemented in an arrangement configured to limit a first routing length on said apparatus by enabling a second routing h in said waveguide and (ii) said arrangement comprises a compact layout with shared vias placed side by side to enable said first routing length to be implemented without a fan-out of traces.

12. A method for implementing a vertical transition from coplanar waveguide to air waveguide using half-mode excitation, comprising the steps of:
   - implementing a first layer comprising a plurality of first through via openings, a first plurality of blind via openings, a coplanar waveguide input and a transition gap;
   - extending a metal strip from an input of said first layer to said coplanar waveguide input, extending a first strip gap along a first side of said metal strip until being blocked from reaching into said transition gap by an angled connection of said coplanar waveguide input to said first layer;
   - extending a second strip gap along a second side of said metal strip and into said transition gap, wherein said second strip gap is separate from said first strip gap;
   - implementing second layer comprising a plurality of second through via openings, a plurality of second blind via openings and an aperture;
   - implementing a third layer comprising a ground;
   - providing a blind via from said first layer to said second layer using said plurality of first blind via openings;
   - providing a blind via from said second layer to said third layer using said plurality of second blind via openings; and
   - providing a through via between said first layer, said second layer and said third layer using said first through via openings and said second through via openings, wherein
     - (a) said coplanar waveguide input comprises a vertical transition to a waveguide,
     - (b) said coplanar waveguide input is configured to transmit an output from a circuit to said waveguide, and
     - (c) said transition gap is next to said coplanar waveguide input.

13. The method according to claim 12, further comprising the steps of:
   - implementing a first dielectric layer in between said first layer and said second layer; and
   - implementing a second dielectric layer in between said second layer and said third layer.

14. The method according to claim 13, wherein (i) said first dielectric layer is a ceramic-filled PTFE composite material and (ii) said second dielectric layer is a FR4 type material.

15. The method according to claim 13, wherein said first dielectric layer is 0.127 mm in thickness and said second dielectric layer is 0.3 mm in thickness.

16. The method according to claim 12, wherein said ground of said third layer is a copper ground.

17. The method according to claim 12, wherein said aperture is a rectangular shape configured to create a back-short cavity.

18. The method according to claim 12, further comprising the step of providing said vertical transition from said coplanar waveguide input to an air waveguide using half-mode excitation.

19. The method according to claim 12, further comprising the steps of:

arranging said first through via openings, said first blind via openings and said second through via openings in a compact layout with shared vias placed side by side to limit a first routing length; and providing a second routing length in said waveguide, wherein said compact layout enables said first routing length to be implemented without a fan-out of traces.

20. An apparatus comprising:

a first layer comprising a plurality of first through via openings, a first plurality of blind via openings and a coplanar waveguide input;

a second layer comprising a plurality of second through via openings, a plurality of second blind via openings and an aperture; and a third layer comprising a ground, wherein (a) said coplanar waveguide input comprises vertical transition to a waveguide, (b) said first through via openings and said second through via openings provide a through via between said first layer, said second layer and said third layer, (c) said plurality of first blind via openings provide a blind via from said first layer to said second layer, (d) said plurality of second blind via openings provide a blind via from said second layer to said third layer, (e) said coplanar waveguide input is configured to transmit an output from a circuit to said waveguide, and (f) said apparatus is configured to provide a wide bandwidth of 20 GHz and low insertion loss of 0.3 dB-0.4 dB at a band of approximately 76 GHz.

* * * * *